United States Patent [19]

Takemae et al.

[11] Patent Number: 4,504,929
[45] Date of Patent: Mar. 12, 1985

[54] DYNAMIC SEMICONDUCTOR MEMORY DEVICE

[75] Inventors: Yoshihiro Takemae, Tokyo; Tsuyoshi Ohira, Kawasaki; Seiji Enomoto, Yokohama, all of Japan

[73] Assignee: Fujitsu Limited, Kawasaki, Japan

[21] Appl. No.: 444,499

[22] Filed: Nov. 24, 1982

[30] Foreign Application Priority Data

Nov. 27, 1981 [JP] Japan .................. 56/190067

[51] Int. Cl.³ .................................. G11C 11/40
[52] U.S. Cl. .................................. 365/210; 371/21
[58] Field of Search .................. 365/210; 371/21

[56] References Cited

U.S. PATENT DOCUMENTS 4,247,917  1/1981  Tsang et al. .......... 365/210
4,301,519  11/1981 Lee ..................... 365/210
4,393,478  7/1983  Kantz et al. .......... 365/210

Primary Examiner—Terrell W. Fears
Attorney, Agent, or Firm—Staas & Halsey

[57] ABSTRACT

A dynamic semiconductor memory device provides a selected real cell, which is connected to a first of a pair of bit lines connected to a sense amplifier, and a dummy cell which is connected to a second of the pair of bit lines so as to perform a read-out operation. The dynamic semiconductor memory cell further provides an active restore circuit for pulling up the bit line potential of the bit line on the higher potential side of the pair of bit lines, in which the potential difference is increased by the read-out operation. The dynamic semiconductor cell can also provide a write-in circuit for charging the selected real cell through the bit line. A test power source pad is provided in the active restore circuit or the write in circuit so that when the reference level of the real cell is tested an optional power source can be applied from the test power source pad instead of from a normal power source.

4 Claims, 10 Drawing Figures

S/A IS ACTUATED

S/A IS ACTUATED

DYNAMIC SEMICONDUCTOR MEMORY DEVICE

BACKGROUND OF THE INVENTION

The present invention relates to a dynamic semiconductor memory device. More particularly, the present invention relates to means for measuring the reference level in a sense amplifier of a dynamic semiconductor memory device.

In a dynamic semiconductor memory device, since charges stored by writing information into a real cell leak with the lapse of time and information "1" or information "0" is reversed at the read-out operation, it is necessary to carry out a refresh cycle so as to maintain the information at "1" or "0". Incidentally, when information "1" is maintained, it is not always necessary to charge a capacitor of a memory cell to a level corresponding to the power source voltage. More specifically, in a dynamic memory device comprising a memory cell of a one-transistor one-capacitor type, the transistor acting as a transfer gate is turned on and the sensing operation is carried out by connecting a capacitor of one real cell and a capacitor of one dummy cell to one of a pair of bit lines connected to a sense amplifier. Accordingly, the charge on the real cell may be discharged to such a level that information "1" is detected by the sense amplifier. This minimum charging state (voltage) of the cell capacitor, allowing the sense amplifier to detect information "1", defines the reference level.

Therefore, the reference level depends on the reduction of the potential level of the bit line, that is, the point of the charge state of the capacitor at which information "1" is substantially reversed to information "0". Measurement of the reference level is important for deciding whether or not a refresh cycle is necessary. According to the conventional technique, the reference level is measured by changing the potential of the counter electrode of the capacitor. That is, at the time of testing, the voltage applied to the counter electrode is increased to $V_{cc}$ (ordinarily 5 Volts)+$\Delta V$, and after the information "1" has been written into the real cell, the level of the counter electrode is returned to $V_{cc}$ and it is determined whether or not information "1" can be read out in this state. For example, if information "1" can be read out even when the applied voltage is increased to 8 Volts ($\Delta V=3$ V), this means that even if the charge voltage of the capacitor of the real cell is reduced to 3 Volts from $V_{cc}$ (5 Volts) during normal operation, information "1" can be read out.

However, according to the conventional method, since the power source voltage in the entire circuit, inclusive of the peripheral circuits, is increased to $V_{cc}+\Delta V$, unfavorable influences on the peripheral circuits and other circuits in which the rated voltage $V_{cc}$ (i.e., 5 Volts) is used, cannot be avoided.

SUMMARY OF THE INVENTION

An object of the present invention is to provide a dynamic semiconductor memory device in which the reference level can be tested without increasing the power source voltage to above the rated value.

Another object of the present invention is to provide a dynamic semiconductor memory device in which the reference level can be tested without the peripheral circuits and other circuits, in which the rated voltage is used, being unfavorably influenced.

The above-mentioned objects can be achieved by a dynamic semiconductor memory device where a selected real cell is connected to one of a pair of bit lines connected to a sense amplifier and a dummy cell is connected to the other one of the pair of bit lines so as to perform the read-out operation. The dynamic semiconductor memory device is characterized in that a test power source pad is mounted on an active restore circuit for pulling up the potential of the bit line on the higher potential side of the pair of bit lines, in which the potential difference is increased by the read-out operation, or on a write-in circuit for charging the selected real cell through the bit line so that an optional power source voltage can be applied from the test power source pad instead of from a normal power source.

Further features and advantages of the present invention will be apparent from the ensuing description, with reference made to the accompanying drawings, to which, however, the scope of the invention is in no way limited.

DESCRIPTION OF THE PREFERRED EMBODIMENTS

Figure 1:
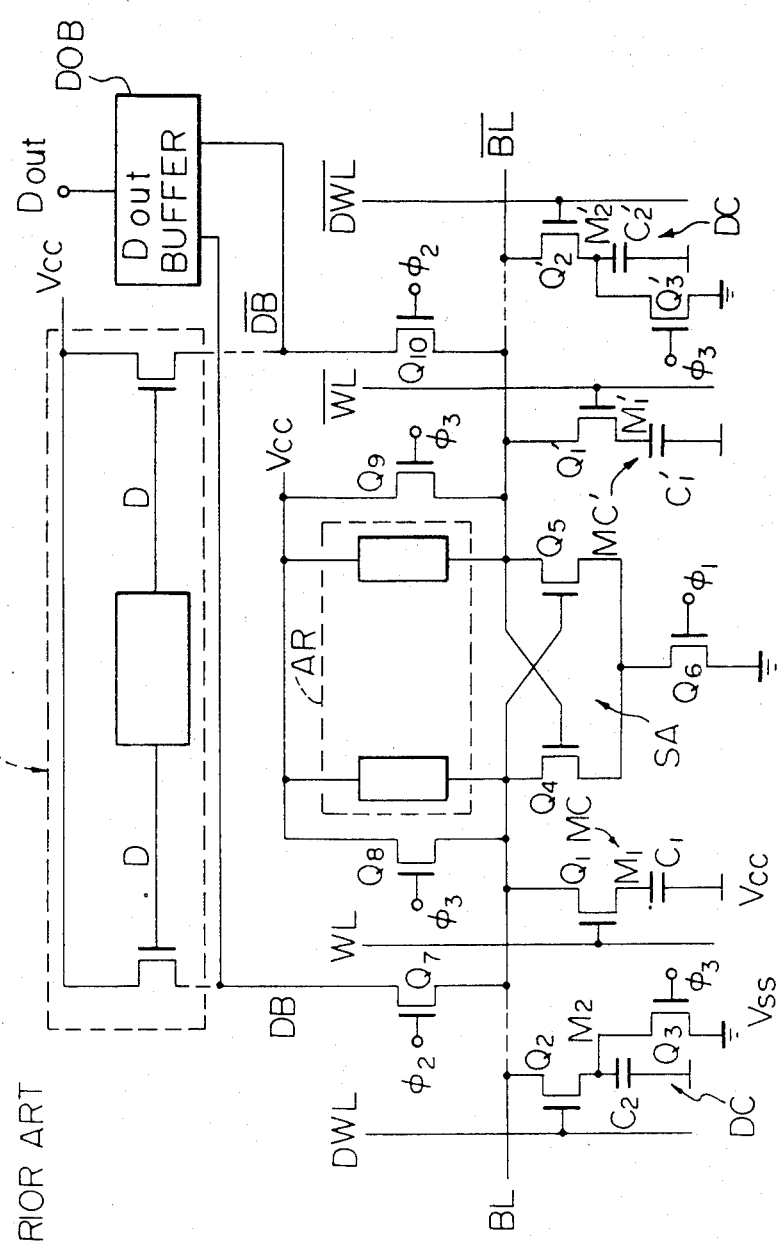
FIG. 1 is a schematic diagram of a circuit of a conventional dynamic semiconductor memory device.

FIG. 1 is a schematic diagram of the structure of a conventional dynamic semiconductor memory device. In FIG. 1, MC and MC' each represent a real cell, DC and DC' each represent a dummy cell, SA represents a sense amplifier, BL and $\overline{BL}$ each represent a bit line, AR represents an active restore circuit for pulling up the potential of the bit line on the higher (H) potential side of the pair of bit lines to the power source voltage $V_{cc}$ after operation of the sense amplifier, DIB represents a data-in buffer used at the time of writing data into the real cell, DOB represents a data-out buffer for reading out data from the real cell, WL and $\overline{WL}$ each represent a word line, and DWL and $\overline{DWL}$ each represent a dummy word line. The real cell MC (MC') comprises one metal-oxide semiconductor (MOS) transistor Q1 (Q1') and one MOS capacitor C1 (C1'), and the potential of the connecting point M1 (M1') (the charge-discharge state of the capacitor) defines information "1" or information "0". The dummy cell DC (DC') comprises a MOS transistor Q2 (Q2') as the transfer gate, a MOS capacitor C2 (C2'), and a resetting MOS transistor Q3 (Q3') for grounding the connecting point M2 (M2'). The sense amplifier SA comprises MOS transistors Q4 and Q5 cross-connected to a pair of bit lines BL and $\overline{BL}$, a current source, and a pull-down MOS transistor Q6.

Precharged MOS transistors Q8 and Q9 are provided to precharge the bit lines BL and $\overline{BL}$ to $V_{cc}$ upon receipt of a clock signal $\phi 3$ of a level higher than $V_{cc}$. Metal-oxide semiconductor transistors Q7 and Q10 act as transfer gates connecting the bit lines BL and $\overline{BL}$ to data buses DB and $\overline{DB}$ when selected.

Figure 2:
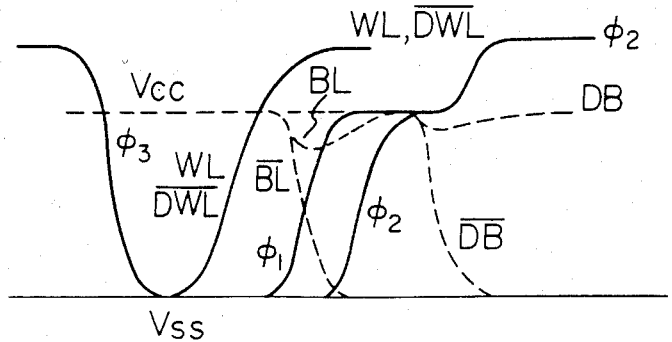
FIGS. 2, 3A, and 3B are timing diagrams of the operation of the circuit shown in FIG. 1.

During the ordinary read-out operation, as shown in FIG. 2, the level of the clock signal $\phi 3$ is elevated to above $V_{cc}$ so as to turn on the transistors Q3 and Q3' and ground the nodes M2 and M2' of the dummy cells DC and DC' (discharge the capacitors of the dummy cells). Simultaneously, the transistors Q8 and Q9 are turned on to precharge the bit lines BL and $\overline{BL}$ to $V_{cc}$. Then, the level of the clock signal $\phi 3$ is dropped to $V_{ss}$ (ground) to turn off the transistors Q3 and Q3', and, for example, the levels of the word line WL and the dummy word line $\overline{DWL}$ are elevated to above $V_{cc}$ to turn on the transistor Q1 of the real cell and the transistor Q2' of the dummy cell DC'. By this operation, the capacitor C2' on the side of the dummy cell DC' (the capacitance of this capacitor is about half the capacitance of the capacitor on the side of the real cell) receives a charge from the bit line $\overline{BL}$ and is charged to a predetermined potential. The charging state of the capacitor C1 on the side of the real cell MC differs depending on whether information "1" or information "0" is written into the real cell. If the capacitor C1 is in a discharged state, the capacitor C1 receives a large quantity of charges from the bit line $\overline{BL}$ and if the capacitor C1 is in a charged state, it receives hardly any charges from the bit line $\overline{BL}$. Therefore charges are redistributed between the bit line BL and the capacitor C1.

FIG. 2 is a case where information "1" is written in to the real cell MC. In this case, if the transistor Q6 is turned on by a clock signal $\phi 1$ to activate the sense amplifier SA, since the relation B1>$\overline{BL}$ is established, the transistor Q5 is turned on (the transistor Q4 is turned off), and the potential level of the bit line $\overline{BL}$ on the side of the dummy cell drops to $V_{ss}$ through the transistors Q5 and Q6. Discharge of the bit line BL on the side of the real cell is not effected, but due to the redistribution of charges between the bit line BL and the capacitor C1, the potential of the bit line BL is slightly reduced. This reduction is compensated for by the active restore circuit AR. In short, the level of the bit line BL is pulled up to $V_{cc}$ and the level of the bit line $\overline{BL}$ is maintained at $V_{ss}$. If a clock signal $\phi 2$ is then raised, the transistors Q7 and Q10 are turned on and a potential difference corresponding to the potential difference between the bit lines BL and $\overline{BL}$ is produced between the data buses DB and $\overline{DB}$, and information "1" is read out by the data-out buffer DOB.

Figure 3A:
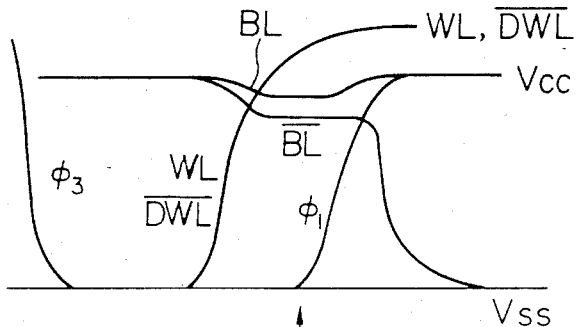
Figure 3B:
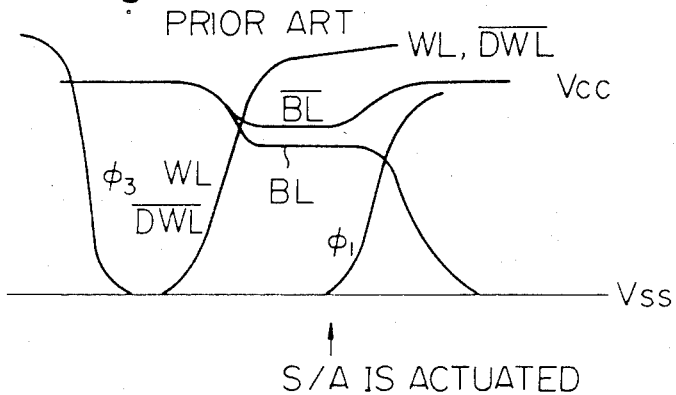

FIG. 3B is a diagram showing a state where information "1" is read out as information "0" due to leakage in the real cell. In short, FIG. 3A shows a case where information "1" is correctly read out because of the relation BL>$\overline{BL}$, as in FIG. 2, that is, a case where sufficient amount of charges remain in the capacitor C1 of the real cell MC, while FIG. 3B shows a case where the charges of the capacitor C1 of the real cell MC in which information "1" has been written are reduced with the lapse of time and the relation BL<$\overline{BL}$ is finally established at the time of operation of the sense amplifier, that is, a case where the stored information is erroneously read out as information "0". Incidentally, in each case, the potential of the bit line $\overline{BL}$ on the side of the dummy cell is kept constant unless the precharge level of the bit line is changed.

As will be apparent from the foregoing description, the reference level depends on the point of reduction of the potential level of the bit line, that is, the point of reduction of the charge state of the capacitor C1, at which level information "1" is substantially reversed to information "0". Measurement of the reference level is important for deciding whether or not a refresh cycle is necessary and for deciding the lower limit value of $V_{cc}$. According to the conventional technique, the reference level is measured by changing the potential of the counter electrode of the capacitor (the electrode attached to the semiconductor substrate through an insulating layer). The counter electrode of the capacitor C1 of the real cell MC in FIG. 1 corresponds to the gate of the MOS transistor, and during normal operation, by applying $V_{cc}$ to this counter electrode, the capacitor C1 is formed. However, at the time of testing, the voltage applied to the counter electrode is increased to $V_{cc}$ (ordinarily 5 Volts)+$\Delta V$, and after information "1" has been written into the real cell MC, the level of the counter electrode is returned to $V_{cc}$ and is checked whether or not information "1" can be read out in this state. For example, if information "1" can be read out even when the applied voltage is increased to 8 Volts ($\Delta V = 3$ Volts), this means that even if the charge voltage of the capacitor of the real cell is reduced to 3 Volts from $V_{cc}$ (5 Volts) during normal operation, information "1" can be read out.

According to this conventional method, however, since the power source voltage in the entire circuit, inclusive of peripheral circuits, is increased to $V_{cc}+\Delta V$, unfavorable influences on the peripheral circuits and other circuits in which the rated voltage $V_{cc}$ (i.e., 5 Volts) is used, cannot be avoided.

Figure 4:
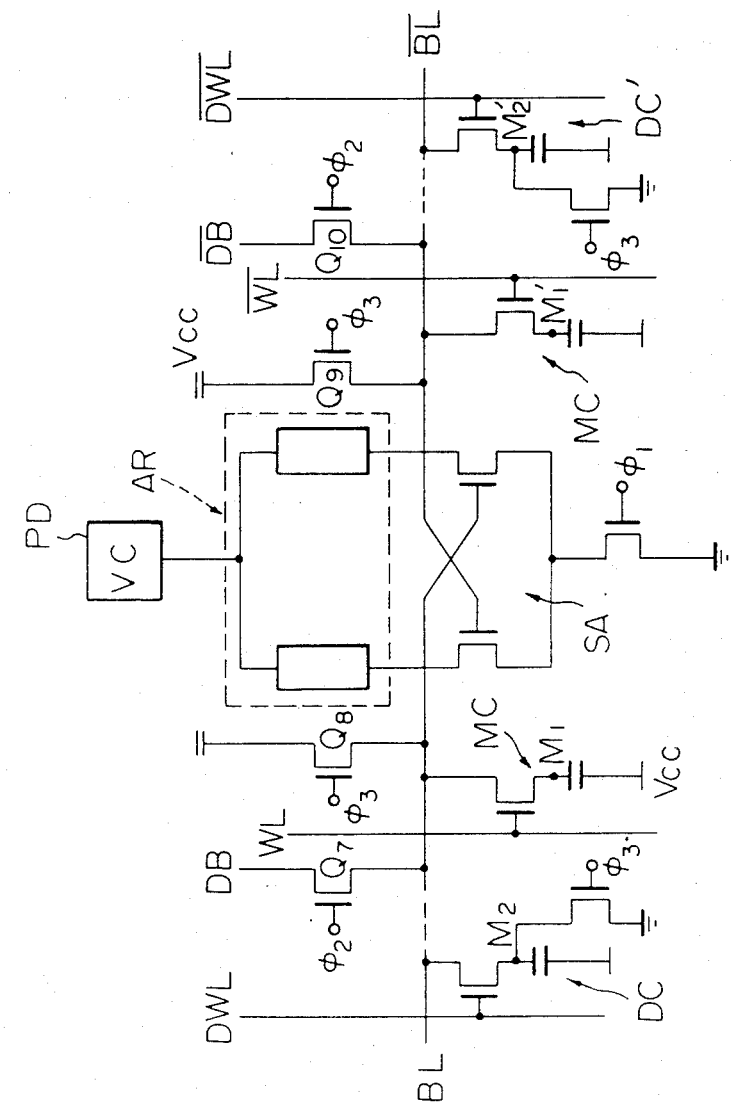
FIG. 4 is a schematic diagram of one embodiment of a circuit of a dynamic semiconductor memory device according to the present invention.
Figure 5:
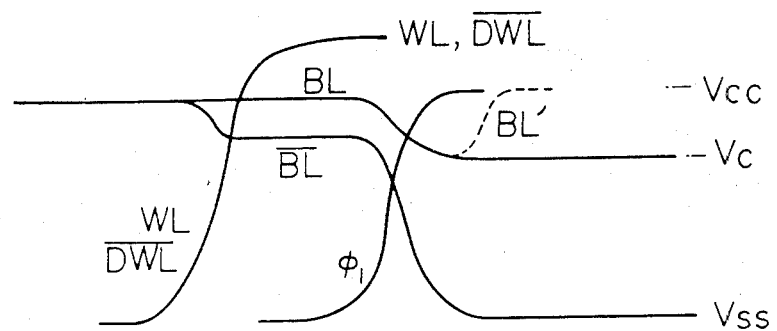
FIG. 5 is a timing diagram of the circuit shown in FIG. 4.

The present invention will now be described in detail with reference to the embodiment illustrated in FIG. 4. FIG. 4 is a diagram of one embodiment of the present invention in which a power source pad PD for applying an optional voltage $V_c$ only to the active restore circuit AR at the time of testing. Since the power source voltage of the active restore circuit in a practical memory device is $V_{cc}$, a line for the power source voltage is laid out so that it can optionally be cut. When this line for $V_{cc}$ is cut, the test sample shown in FIG. 4 is constructed. Incidentally, the test sample in which the line for $V_{cc}$ is cut is not put to practical use. In the connection state shown in FIG. 4, if a voltage $V_c$ lower than $V_{cc}$ is applied to the pad PD, the potential levels of the bit lines BL and $\overline{BL}$ are changed as shown in FIG. 5. More specifically, if the read-out operation is carried out in a state where information "1" is written into the real cell MC, a potential difference, as shown in FIG. 5, is produced between the paired bit lines BL and $\overline{BL}$, and when the sensing operation is initiated by the clock signal $\phi 1$, this potential difference is increased. As was pointed out hereinbefore, at this time, the active restore circuit AR pulls up the potential of the bit line BL on the higher potential side of the pair of bit lines to $V_{cc}$, as indicated by the dashed line BL'. According to the present invention, since the recovering voltage is $V_c$ ($<V_{cc}$), the capacitor C1 of the real cell is charged (charges are rewritten) only to $V_c$ at the highest. If the read-out operation is carried out in this state and the relation BL<$\overline{BL}$ is established, the state explained hereinbefore with respect to FIG. 3B is brought about, the read-out result is inverted, and it is seen that the applied voltage $V_c$ is lower than the reference level. The value of the voltage $V_c$ is gradually reduced to below $V_{cc}$ and is restored and the read-out information is finally reversed. The value of $V_c$, just before the reversal, indicates the reference level. This method is advantageous in that only the write-in voltage for the real cell is reduced while maintaining the voltage in other circuits at a normal level.

Figure 7:
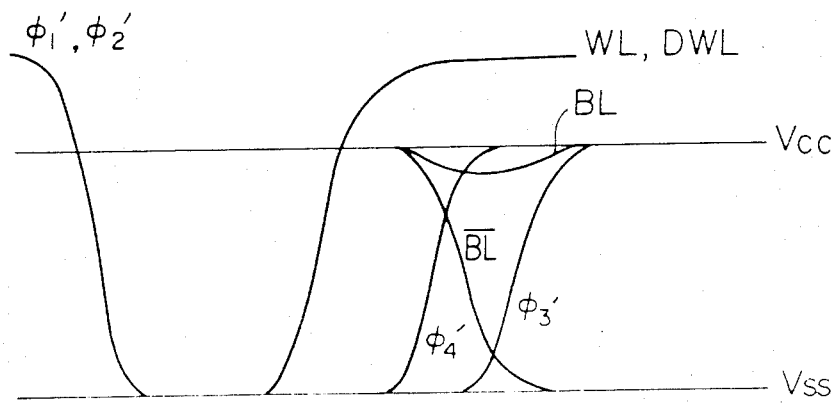
FIG. 7 is a timing diagram of the circuit shown in FIG. 6.
Figure 6:
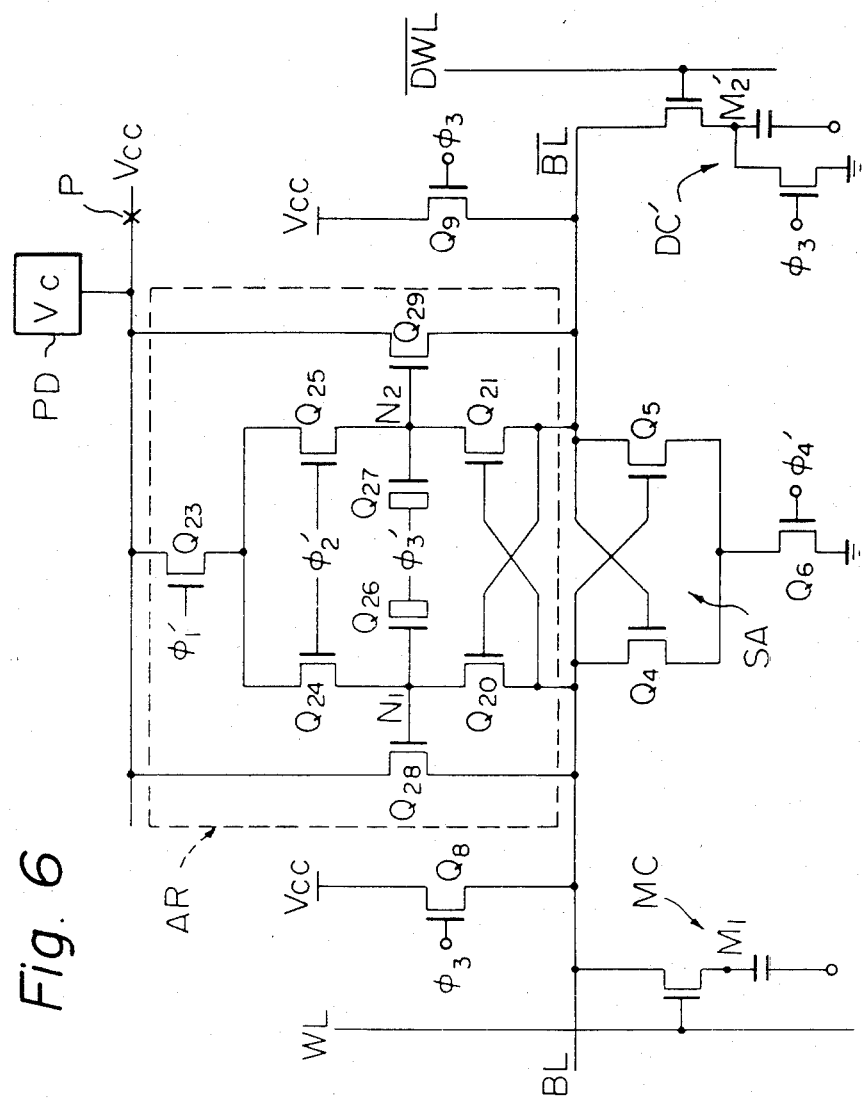
FIG. 6 is a circuit diagram of a specific example of the circuit shown in FIG. 4.

FIG. 6 shows a specific example of the active restore circuit AR of the embodiment shown in FIG. 4. This active restore circuit AR has differential paired transistors Q20 and Q21 as the sense amplifier SA, whereby the voltage recovering action is imposed only on the bit line on the higher potential side of the pair of bit lines. More specifically, as shown in FIG. 7, the levels of clock signals $\phi_1'$ and $\phi_2'$ are elevated to above $V_{cc}$ during normal operation, and both the nodes N1 and N2 are charged to the level $V_{cc}$. Then the levels of the clock signals $\phi_1'$ and $\phi_2'$ are reduced. When the levels of the word line WL and the dummy word line $\overline{DWL}$ are elevated to above $V_{cc}$, if information "1" is written into the real cell MC, the potential level of the bit line $\overline{BL}$ becomes slightly lower than that of the bit line BL. When the sense amplifier SA is then activated by a clock signal $\phi_4'$, a minute potential level difference between the bit lines BL and $\overline{BL}$ is detected, and the transistor Q5 is turned on while the transistor Q4 is turned off, with the result that the potential level difference between the bit lines BL and $\overline{BL}$ is increased. Simultaneously, the transistor A21 is turned on and the transistor A20 is turned off, and, therefore, the charge on the node N2 is discharged through the bit line $\overline{BL}$ and a charge remains only on the side of the node N1. If a clock signal $\phi_3'$ is applied to one end of the capacitors Q26 and Q27 in this state, the voltage level of the node N1 is elevated to above $V_{cc}$ and the transistor Q28 is completely turned on, with the result that the potential level of the bit line BL is pulled up to $V_{cc}$. Since the transistor Q29 is in the "off" state at this time, the potential of the bit line $\overline{BL}$ is maintained at $V_{ss}$. According to the present invention, the pad PD is mounted on the power source in series with the active restore circuit AR, and the $V_{cc}$ line is cut at the point P in the test sample. Accordingly, the highest voltage of the bit line BL is limited to $V_c$.

Figure 8:
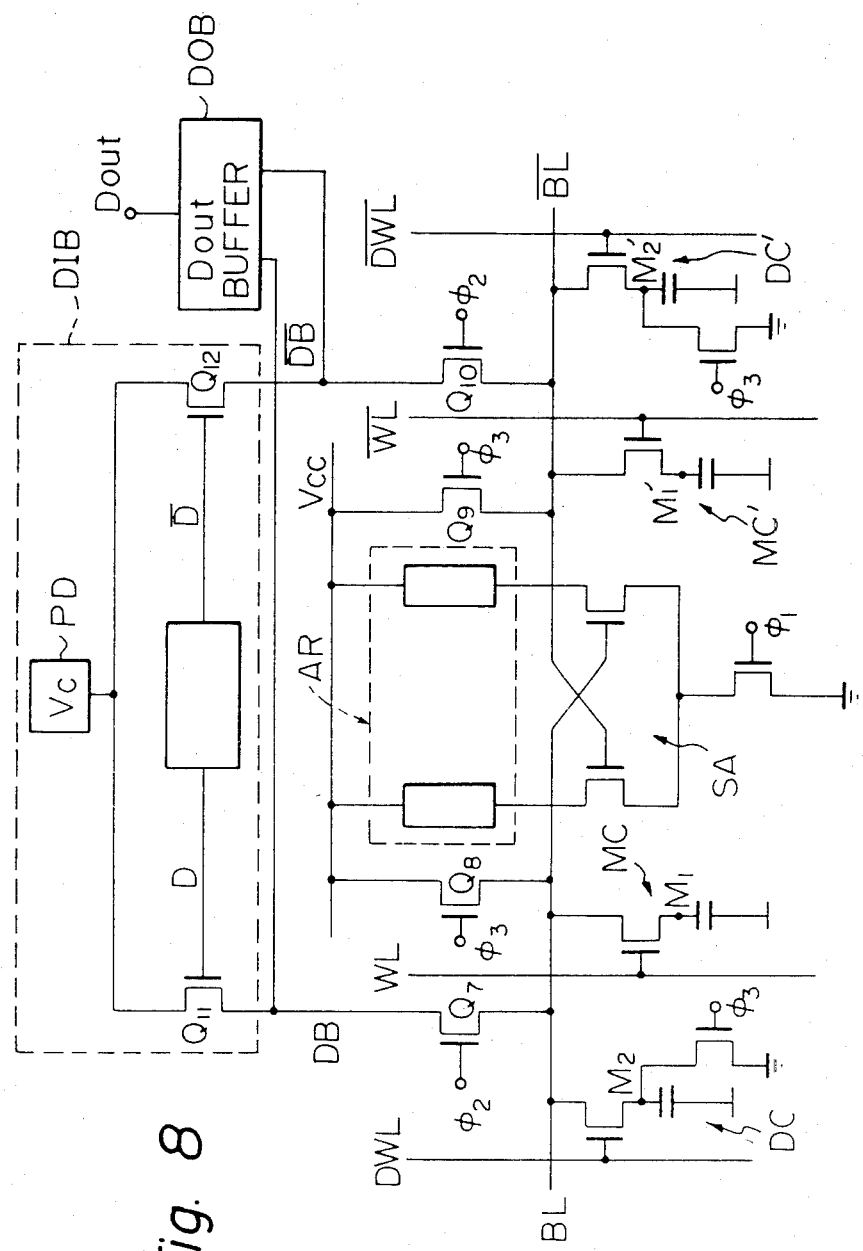
FIG. 8 is a schematic diagram of another embodiment of the circuit of the dynamic semiconductor memory device according to the present invention.

FIG. 8 is another embodiment of the present invention in which the pad PD is mounted on the data-in buffer DIB while the active restore circuit is not modified. In this embodiment, the restoring voltage is not reduced to below $V_{cc}$ but the write-in voltage is directly reduced to below $V_{cc}$. More specifically, at the time of the write-in operation, one of the transistors Q11 and Q12 is turned on according to the data D or $\overline{D}$. For example, when information "1" is written into the real cell MC, the transistor Q11 is turned on; but at this time, by reducing the voltage for charging the bit line BL to $V_c$ ($<V_{cc}$), the quantity of charges accumulated in the real cell MC is intentionally reduced, and it is determined whether or not information "1" can normally be read out. Also in this embodiment, the write-in and read-out operations are repeated while gradually reducing the value of $V_c$.

Figure 9:
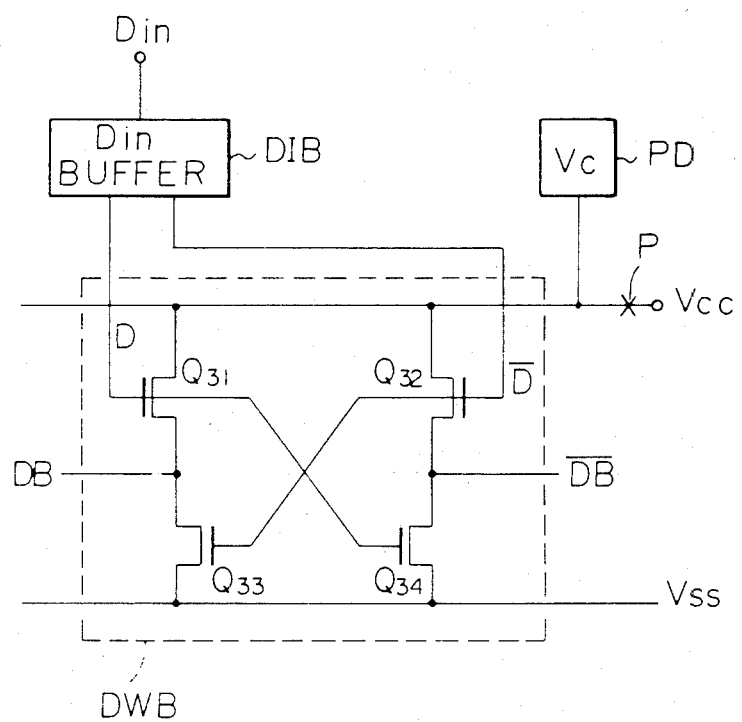
FIG. 9 is a circuit diagram of a specific example of the circuit shown in FIG. 8.

FIG. 9 shows a specific example of the data-in buffer DIB of the embodiment shown in FIG. 8. The data-in buffer DIB receives write-in data Din to maintain one of the outputs D and $\overline{D}$ at a high level and the other output at a low level. The data write-in buffer DWB comprises transistors Q31 through Q34 connected as shown in FIG. 9. When the output D is at a high level and the output $\overline{D}$ is at a low level, the transistors Q31 and Q34 are turned on and the transistors Q32 and Q33 are turned off, with the result that the data bus $\overline{DB}$ is maintained at $V_{cc}$ and the data bus DB is maintained at $V_{ss}$. If the levels of the outputs D and $\overline{D}$ are reversed, the potential levels of the data buses DB and $\overline{DB}$ are reversed. During testing, the power source $V_{cc}$ is cut at the point P and the voltage $V_c$ is applied to the pad PD with a probe or the like.

As will be apparent from the foregoing description, according to the present invention, since the power source voltage $V_{cc}$ need not be elevated to above the rated value, the reference level can be measured without any unfavorable influences on other circuits.

We claim:

1. A dynamic semiconductor memory device comprising:
   a pair of bit lines including first and second bit lines;
   a sense amplifier operatively connected to said pair of bit lines;
   a real cell operatively connected to said first bit line of said pair of bit lines;
   a dummy cell, operatively connected to said second bit line of said pair of bit lines, for performing a read-out operation;
   an active restore circuit, operatively connected to said pair of bit lines, for pulling up the bit line potential of the bit line on the higher potential side of said pair of bit lines, in which the potential difference is increased by the read-out operation; and
   a test power source pad, operatively connected to said active restore circuit, for receiving and providing an optional and normal power source voltage to said active restore circuit.

2. A dynamic semiconductor memory device according to claim 1, wherein, when said dynamic semiconductor memory device is tested a voltage lower than the normal power source is supplied to said test power source pad, and the read-out operation in said real cell is repeated while decreasing the voltage so as to determine the minimum voltage level of said real cell.

3. A dynamic semiconductor memory device comprising:
   first and second bit lines;
   a sense amplifier operatively connected to said first and second bit lines;
   a real cell operatively connected to said second bit line;
   a write-in circuit, operatively connected to said real cell, for charging the real cell; and
   a test power source pad having an optional power source voltage, operatively connected to said write-in circuit, for applying the optional power source voltage to said write-in circuit.

4. A dynamic semiconductor memory device according to claim 3, further comprising a data-in buffer operatively connected between said test power source pad and said write-in circuit.

* * * * *